United States Patent [19]

Spector

[11] Patent Number: 5,146,501
[45] Date of Patent: Sep. 8, 1992

[54] ALTITUDE-SENSITIVE PORTABLE STEREO SOUND SET FOR DANCERS

[76] Inventor: Donald Spector, 380 Mountain Rd., Union City, N.J. 07087

[21] Appl. No.: 667,179

[22] Filed: Mar. 11, 1991

[51] Int. Cl.⁵ .................... H04R 1/10; H03G 9/00; H03G 3/00
[52] U.S. Cl. ........................... 381/25; 381/74; 381/102; 381/104
[58] Field of Search ............ 381/25, 74, 102, 104, 381/1

[56] References Cited

U.S. PATENT DOCUMENTS

| | | | |
|---|---|---|---|
| 3,962,543 | 6/1976 | Blanert et al. | 381/25 |
| 4,167,818 | 9/1979 | Cantarella | 33/366 |
| 4,320,534 | 3/1982 | Sakai | 381/102 |
| 4,701,952 | 10/1987 | Taylor | 381/25 |
| 4,928,311 | 5/1990 | Trompler | 381/74 |
| 5,005,202 | 4/1991 | Pavel | 381/25 |

*Primary Examiner*—James L. Dwyer
*Assistant Examiner*—Jack Chiang
*Attorney, Agent, or Firm*—Michael Ebert

[57] ABSTRACT

A portable stereo sound set adapted to be worn by a dancer who listens to dance music through left and right earphones mounted on his head and connected to the binaural amplifier channels of the set. Included in each channel is an amplitude-control stage to adjust the base level of sound volume in the related earphone. Attached to each earphone is an attitude-sensitive potentiometer connected to the amplitude control stage on the corresponding channel. The volume of sound in each earphone is caused to deviate from the base level in a direction and to an extent which is a function of the changing resistance of the related potentiometer. The resultant volume of sound heard in each earphone therefore depends on the inclination or tilt of the head of the dancer. Because the dancer's movements are reflected in the changing attitude of his head, the volume of sound, as heard by the dancer through the earphones, is coordinated with his movements, thereby creating a feedback relationship therebetween which enhances the dancing experience.

6 Claims, 2 Drawing Sheets

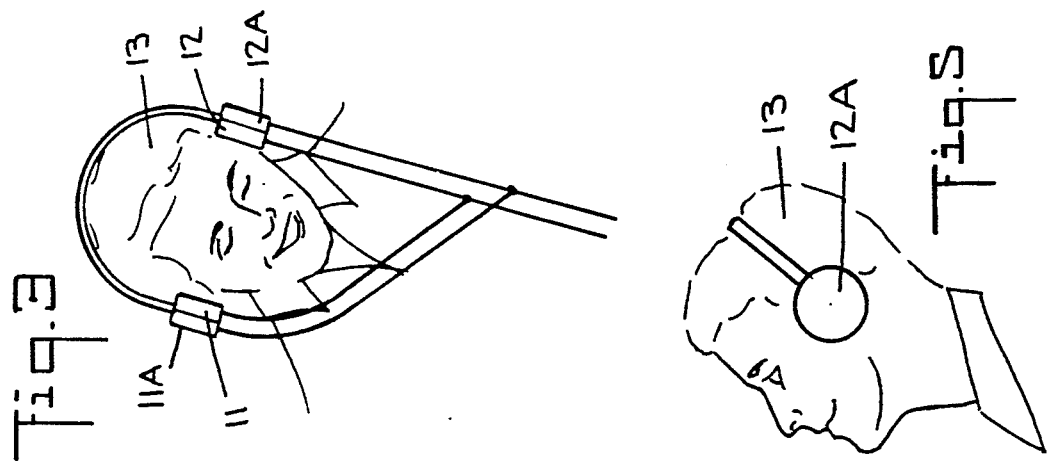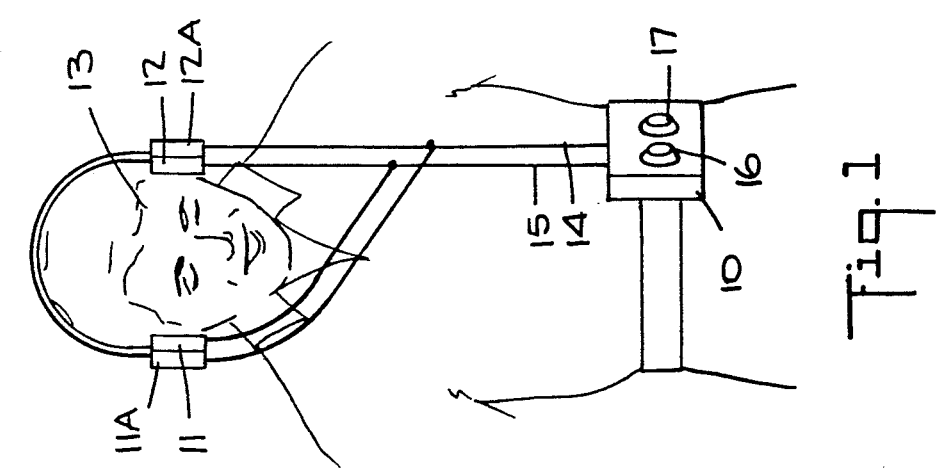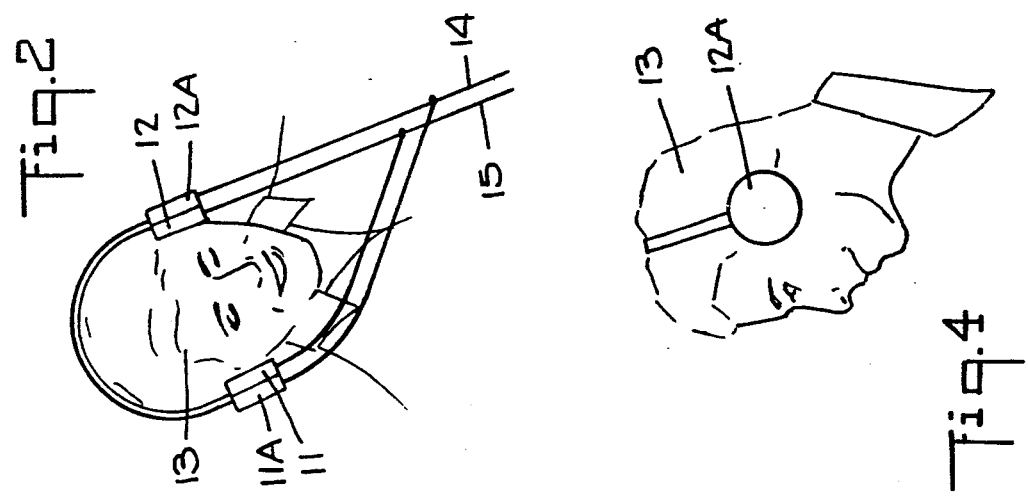

ALTITUDE-SENSITIVE PORTABLE STEREO SOUND SET FOR DANCERS

BACKGROUND OF INVENTION

1. Field of the Invention

This invention relates generally to portable stereo sound sets, such as a set that includes a cassette stereo tape player and a stereo FM radio, and more particularly to a set of this type to be worn by a dancer who listens to music through stereo earphones mounted on his head, the earphones being each provided with an attitude-sensitive device functioning to vary the volume of sound heard in the earphone so as to coordinate the sound volume with the dancer's movements as reflected in the changing attitude of the dancer's head.

2. Status of Prior Art

In a stereo sound system, whether an FM radio or a stereo record player, the audio signals are fed into two independent audio amplifier channels, each terminating in a loudspeaker or earphone. This system functions to give the listener an aural perspective similar to that he would receive at the original sound source.

Portable stereo cassette tape player/radio sets, such as the well-known SONY WALKMAN are now widely available. These sets are adapted to be clipped onto or otherwise worn or carried by an individual who listens to broadcast or tape recorded stereo music through left and right earphones mounted on his head. A stereo set of this type includes binaural amplifier channels, each being provided with an amplitude-control stage to adjust the base level of the volume of sound heard in the related earphone.

Individuals equipped with such portable stereo sound sets often dance as they listen to the music, just as they would when hearing music in a night club or disco. It is not an uncommon street sight to see an adolescent carrying a portable stereo sound set and wearing stereo earphones on his head, gyrating to rock music that he alone can hear. This activity is also carried out by many individuals in the privacy of their homes.

When in a night club or disco an individual dances to the music being played, his movements are reflected in the attitude of his head, particularly in dancing to rock music. Thus as he dances, his head will tilt from side to side or incline in the forward or reverse direction in keeping with the tempo of the music, thereby translating, as it were, musical expression into body language.

When a dancer throws his head to one side, the music as heard in the ear that is then up becomes somewhat louder than that heard in the ear that is then down. While this difference in volume is not pronounced, the human ear is highly sensitive to such changes. Changes in volume of sound heard by both ears also occur when the head is thrown back or thrust forward. In that case, the volume in both ears is at the same level, but this volume rises and falls depending on the inclination of the head.

With a changing head orientation or attitude relative to the sound source, the volume of the sound in both ears may be increased or decreased to the same degree, or the volume of sound heard in one ear relative to that in the other ear may go up or down. Hence even though in a night club or a disco, it is recorded rather than live music that is being heard by a dancer, the dancer nevertheless experiences through his ears an apparent coordination of the pulse and expressive content of the dance music with his own movements.

The importance of this interaction can best be explained by analogy. When a company of dancers performs on a stage accompanied by a live orchestra whose conductor observes the dancers, the conductor will coordinate the performance of the musicians under his control with those of the dancers. Thus a conductor who senses that the beat of the music may be too fast for the dancers to follow will slow down the beat to accommodate the dancers. And when the dance activity his highly vigorous, the conductor will raise the volume of the music to accompany this activity and thereby intensify the impact of the performance on the audience.

But this is not a one-way street, for in dancing to music, dancer seeks to express in movement the tempo and expressive content of the music. Hence there is a dynamic interaction between the music being performed and the dancer's movements. But if a dancer performs to recorded music, there can be no such interplay, for the reproduction of the recorded music is altogether independent of the dancer's movements.

A similar situation exists for a dancer who is hearing dance music through stereo headphones, for there is no coordination between the dance music and the dancer's movements. The reason for such lack of coordination is that what the dancer hears through earphones mounted on his head is at a pre-adjusted volume level that is independent of the attitude of the head. Regardless of how the dancer changes his head orientation in keeping with the pulse of the music, the volume level of the music remains unchanged. As a consequence, the dancer is deprived of the interactive experience between movement and dance and the emotional rewards which accompany this experience.

Because the present invention makes use of attitude-sensitive potentiometers which are attached to the earphones, the following patents, through unrelated to stereo sound systems, are nevertheless pertinent, for they disclose in another context attitude-sensitive potentiometers.

The Cantarella et al. U.S. Pat. Nos. 4,167,818 and 4,244,177 disclose an electronic inclination gauge or level to determine the degree to which a surface is inclined with respect to a vertical or horizontal plane, use being made of a gravity-sensing potentiometer.

SUMMARY OF INVENTION

In view of the foregoing, the main object of this invention is to provide a portable stereo set to be used by a dancer, the set having attitude-sensing means which function to coordinate the volume of sound heard through the earphones with the dancer's movements.

More particularly, an object of this invention is to provide a set of the above type in which each earphone incorporates an attitude-sensitive potentiometer whose resistance varies as a function of the orientation of the dancer's head, the resistance being included in the amplitude-control stage of the amplifying channel feeding audio signals to the earphone.

Also an object of this invention is to provide a portable set having both a radio and a cassette record player so that fed into the earphones are either broadcast stereo music and recorded stereo music.

Still another object of this invention is to provide a portable set for dancers that can be mass produced at relatively low cost.

Briefly stated, these objects are attained in a portable stereo sound set adapted to be worn by a dancer who listens to dance music through left and right earphones mounted on the head of the dancer and connected by lines to the binaural amplifier channels of the set. Included in each channel is an amplitude-control stage to adjust the base level of sound volume in the related earphone. Attached to each earphone is an attitude-sensitive potentiometer connected by lines to the amplitude-control stage in the corresponding channel.

The volume of sound in each earphone is caused to deviate from the base level in a direction and to an extent which is a function of the changing resistance of the related potentiomer. The resultant volume of sound heard in each earphone therefore depends on the inclination or tilt of the head of the dancer. Because the dancer's movements are reflected in the changing attitude of his head, the volume of sound, as heard by the dancer through the earphones, is coordinated with his movements, thereby creating a feedback relationship therebetween which enhances the dancing experience.

BRIEF DESCRIPTION OF DRAWINGS

For a better understanding of the invention as well as other objects and further features thereof, reference is made to the following detailed description to be read in conjunction with the accompanying drawings, wherein:

FIG. 1 shows a dancer whose head is erect wearing a portable stereo set in accordance with the invention, and having mounted on his head stereo earphones which are plugged into the set;

FIG. 2 shows the dancer with his head tilted to the left;

FIG. 3 shows the dancer with his head tilted to the right;

FIG. 4 shows the dancer with his head inclined in the forward direction;

FIG. 5 shows the dancer with his head rearwardly inclined;

DESCRIPTION OF INVENTION

The Stereo Sound Set

Figure 6:
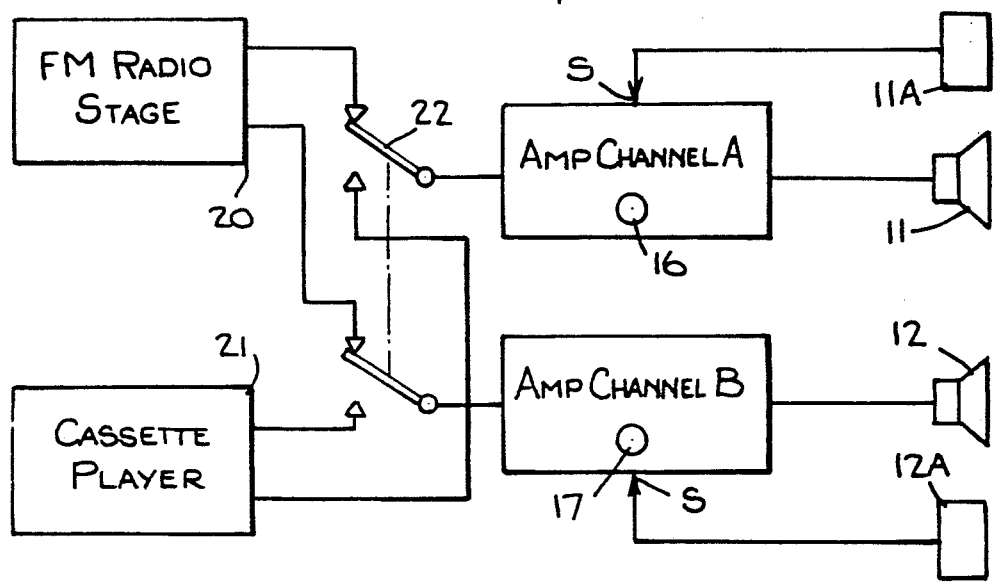
FIG. 6 is a block diagram of the basic elements of the stereo sound set.

Referring now to FIG. 1, there is shown a stereo sound set 10 in accordance with the invention, set 10 being clipped onto or otherwise attached to the body of a dancer on whose head earphones are mounted. In FIG. 1, the head is erect and therefore in line with a vertical axis. However, as previously explained, the orientation of the head relative to the vertical axis will change as the dancer moves in a manner expressive of the dance music he hears through the earphones.

Set 10, which in practice may be a stereo radio or a stereo cassette player, or a set which combines both a radio and a player, includes, as is conventional, left and right binaural amplifying channels which feed left and right earphones 11 and 12 mounted on head 13 of the dancer. The earphones are connected by a flexible line 14 terminating in a plug. The plug is received in a socket that connects the left and right earphones to the left and right amplifying channels, as in a conventional stereo set.

Attached to or incorporated in left earphone 11 is an attitude-sensitive device 11A, which may be any sensor that produces an electrical signal or resistance value as a function of the orientation or attitude of the device. Preferably, device 11A is an attitude-sensitive potentiometer whose structure and function will hereafter be described. A like attitude-sensitive potentiometer 12A is joined to or incorporated in right earphone 12. Potentiometers 11A and 12A are connected by a line 15 terminating in a plug received in a socket connecting the potentiometers to the amplitude-control stages of the corresponding amplifying channels.

Set 10 is provided with a control knob 16 which is coupled to volume control means such as a standard potentiometer in the amplitude-control stage of the left amplifying channel of the stereo set. By turning knob 16, one can adjust the base level of the volume of sound heard in left earphone 11 from a low level to a medium level to a high level, as with any conventional volume control. Control knob 17 carries out a like function in the right amplifying channel of the set.

Attitude-sensing potentiometers 11A and 11B are so connected by line 15 to the amplitude-control stages of the corresponding amplifying channels to cause the volume of sound fed to the earphones to deviate from the adjusted base level in a direction and to an extent that reflects the attitude of the sensing device.

The various changes in attitude are illustrated in FIGS. 2 to 5. In FIG. 1, head 13 of the dancer is erect; hence the attitude-sensing potentiometers 11A and 12A are each aligned with a vertical axis, and the resultant ohmic resistance of this potentiometer is indicative of this attitude. In FIG. 2, head 13 is tilted to the left, both potentiometers 11A and 12A being then tilted, with potentiometer 12A then higher than potentiometer 11A. This condition is reversed in FIG. 3, where head 13 is tilted to the right, and where the tilted potentiometer 11A is then higher than potentiometer 12A. In FIG. 4, head 13 is forwardly inclined, and the potentiometers, which are both at the same level, are then similarly inclined, while in FIG. 5, the situation is reversed, for now head 13 is rearwardly inclined.

The ohmic resistance of each attitude-sensitive potentiometer depends on its orientation and is different for an inclined or tilted position than for an erect position. The direction in which the resistance changes—that is, whether the resistance goes higher or lower, and the extent to which the resistance goes higher or lower is a function of attitude. Thus a slight forward inclination will result in a slight change in resistance in one direction, and a more pronounced rearward inclination will result in a large change in resistance in the other direction. These changes in resistance which result from changes in attitude are reflected in the volume of sound heard in the earphones.

Hence as the dancer wearing the earphones on his head hears dance music and moves his head in various ways to express by such movement the tempo and other expressive characteristics of the music, this head movement results in changes in the volume of the sound of the music being supplied in the left and right amplifying channels and being fed to the left and right earphones.

Thus the dance music heard by the dancer animates the dancer to express this movement by head movement, and this movement in turn so alters the volume of music in the earphones, either by causing the volume in both earphones to increase or decrease concurrently to the same degree, or to increase or decrease in volume in one earphone relative to the volume in the other. As a consequence, a feedback relationship is created between the music and the dancer's movement, and this acts to enhance the dancing experience, for now there is a dynamic interaction between music and movement.

The Stereo System

Figure 7:
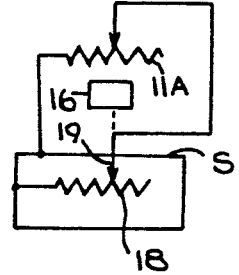
FIG. 7 schematically shows the relationship of an attitude-sensitive potentiometer to the volume control potentiometer in the amplitude control stage of an amplifying channel included in the set.

FIGS. 6 and 7 disclose the basic elements of the system formed by set 10 and the earphones and attitude sensors plugged therein. The system includes an FM stereo radio stage 20 and a stereo tape cassette player 21. These are connected selectively by a double-pole, double-throw switch 22 to binaural amplifying channels A and B whose audio outputs are applied to left and right earphones 11 and 12. The amplitude control stage S of amplifying channel A is provided with control knob 16, and the corresponding stage S in channel B is provided with control knob 17.

Attitude-sensitive potentiometer 11A is connected to the amplitude control stage S of channel A, and attitude-sensitive potentiometer 12A is connected to stage S of channel B. The audio volume produced by each channel is determined by the existing setting of the volume control knob which establishes the base level of the volume and by the related attitude sensor which causes the volume to deviate in direction and extent from the base level as a function of the changing attitude.

FIG. 7 illustrates the stage S of channel A which includes a standard potentiometer 18 having a slider 19 operated by control knob 16 so that as slider 19 is adjusted by the knob, the resistance of the potentiometer is decreased or increased to vary the amplification of this channel and hence the base volume of the sound applied to the earphone. Shunted across potentiometer 18 is attitude-sensitive potentiometer 11A. Hence the two potentiometers are connected in parallel relation and together determine the ohmic value introduced into the amplitude-control stage S.

The ohmic value of potentiometer 18 is adjusted by knob 18 to set the base level of volume. But as the ohmic value of attitude-sensitive potentiometer 11A changes with changes in head position, the volume is caused to deviate above and below the set basic level so as to reflect changes in head movement.

The Attitude-Sensitive Potentiometer

Figure 8:
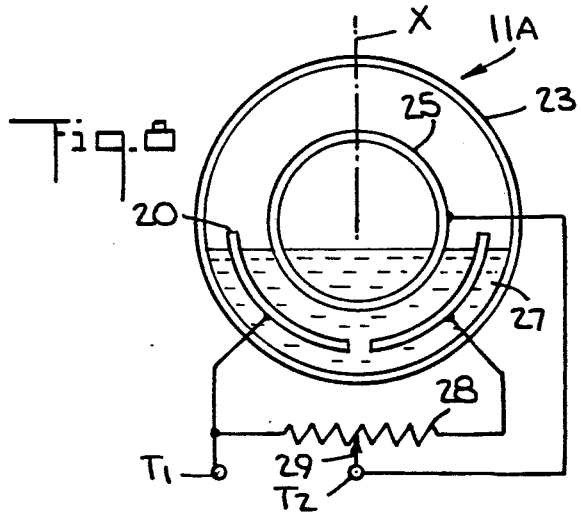
FIG. 8 schematically shows the attitude-sensitive potentiometer.

As shown in FIG. 8, attitude-sensitive potentiometer 11A (which is the same as potentiometer 12A) is in the form of a sealed circular cell 23 partially filled with a semi-conductive liquid 24. This liquid may be alcohol having glycerine therein to impart some viscosity to the liquid to prevent it from splashing in the cell.

Housed within cell 23 is an electrode ring 25 which is coaxial with the circular cell. Concentrically disposed with respect to the lower half of ring 23 are left and right arcuate electrodes 26 and 27 which when the cell is aligned with a vertical axis X are symmetrical with respect to this axis. When so oriented, liquid 24 is equally distributed with respect to electrodes 26 and 27.

The potentiometer is provided with output terminals $T_1$ and $T_2$, terminal $T_1$ being connected to electrode 26 and terminal $T_2$ to electrode ring 25.

Resistance 28 and the slider 29 therefor is equivalent to the resistance presented by the potentiometer cell and therefore is used to represent the resistance presented by the potentiometer. Ring electrode 29 effectively acts as a slider with respect to the liquid resistance between electrodes 26 and 27. The surface of liquid 24, because of gravity, is always parallel to a horizontal axis, regardless of the orientation of the cell with respect to vertical axis X; that is, the direction and degree to which the cell is tilted or inclined relative to the vertical axis.

Figure 9:
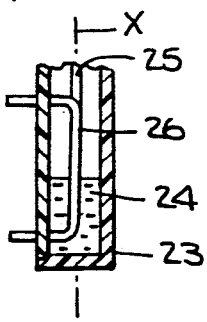
FIG. 9 shows the potentiometer when it is aligned with a vertical axis.

When the liquid surface is at right angles to vertical axis X, as shown in FIGS. 8 and 9, then the resistance of the liquid between ring electrode 25 and arcuate electrode 26 is the same as that between the ring electrode and arcuate electrode 27. The slider is then effectively midway between the ends of resistance 28.

Figure 10:
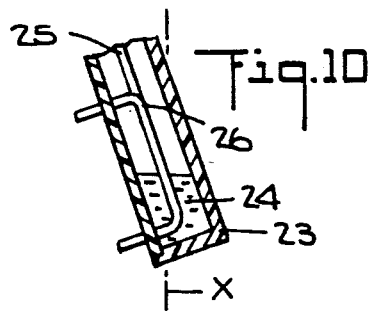
FIG. 10 shows the potentiometer when it is forwardly inclined relative to the vertical axis.
Figure 11:
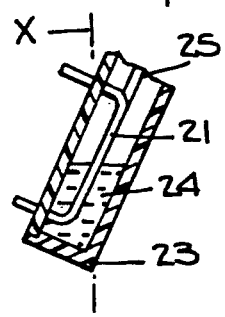
FIG. 11 shows the potentiometer when it is rearwardly inclined relative to the vertical axis.

The resistance presented between terminals $T_1$ and $T_2$ is the resistance between slider 29 and electrode 26. This resistance changes as the relative distribution of the liquid between center electrode 25 and the outer electrode changes when a tilt or inclination of the cell from the vertical axis takes place. Thus FIG. 9 shows semiconductive liquid 24 whose surface is always along the horizontal axis at right angles to vertical axis X, this being the erect state of the cell which exists when the head of the dancer is erect. FIG. 10 shows a tilt to the left of axis X, and FIG. 11 a tilt to the right of axis X.

When the cell tilts to the left, then the level of the liquid rises with respect to electrode 26 and falls with respect to electrode 27, thereby reducing the resistance between terminals $T_1$ and $T_2$. When the cell tilts to the right, then the liquid rises with respect to electrode 27 and falls with respect to electrode 26, thereby increasing the resistance between the output terminals of the potentiometer. Hence the potentiometer acts as an attitude sensor to present a resistance value that depends on the orientation of the head on which the potentiometer is mounted.

While there has been shown and described a preferred embodiment of a portable stereo sound set for dancers in accordance with the invention, it will be appreciated that many changes and modifications may be made therein without, however, departing from the essential spirit thereof. Thus instead of an attitude-sensitive potentiometer which makes use of a semiconductive liquid, the sensor may be constituted by a weighted pendulum whose position because of gravity is always along the vertical axis, the pendulum being pivoted on an axle which turns the slider of a variable resistor whose position changes with changes in orientation. And instead of connecting the attitude-sensitive potentiometer in the amplitude-control stage of an amplifying channel, it may be included in a resistance pad interposed between the output of the channel and the related earphone to vary the audio current applied to the earphone as a function of attitude.

I claim:

1. A portable stereo system for a dancer comprising:
   (a) a portable stereo sound set adapted to be worn by a dancer, said set including left and right binaural audio signal amplifying channels, each having an adjustable amplitude control stage;
   (b) left and right electrically operated earphones mounted on the head of the dancer and connected by an electrical line to the outputs of the corresponding channels of the set whereby dance music conveyed as audio signals through the channels and applied to the earphones is heard in stereo by the dancer at a base volume level determined by the setting of said amplitude-control stage; and (c) left and right attitude-sensitive electrical devices attached to the corresponding earphones mounted on the head of the dancer and so connected to the corresponding channels of the set as to cause deviations from the base level of volume heard in the earphones to an extent that depends on the orientation of the head, whereby the volume of sound heard by the dancer is coordinated with his head movement.

2. A system as set forth in claim 1, wherein said devices are connected by a line to respective amplitude-control stages.

3. A system as set forth in claim 1, wherein said set includes an FM radio and a stereo cassette player and a selector switch to connect either said radio or said player to the input of the channels.

4. A system as set forth in claim 1, wherein each stage includes a standard potentiometer to vary the amplitude of the audio signal in the related channel.

5. A system as set forth in claim 1, wherein said device is an attitude-sensitive potentiometer.

6. A system as set forth in claim 5, wherein said potentiometer includes a sealed cell containing a semiconductive liquid and electrodes immersed in said liquid.

* * * * *

UNITED STATES PATENT AND TRADEMARK OFFICE
CERTIFICATE OF CORRECTION

PATENT NO. : 5,146,501

DATED : September 8, 1992

INVENTOR(S) : Donald Spector

It is certified that error appears in the above-identified patent and that said Letters Patent is hereby corrected as shown below:

Title page, item [54] and column 1, line 2, change "Altitude" to --Attitude--.

Signed and Sealed this

Thirty-first Day of August, 1993

Attest:

BRUCE LEHMAN

*Attesting Officer*   *Commissioner of Patents and Trademarks*